United States Patent [19]

Matsubara et al.

[11] Patent Number: 4,511,819

[45] Date of Patent: Apr. 16, 1985

[54] ELECTRODE CONNECTIONS FOR A PIEZOELECTRIC SENSOR

[75] Inventors: Naoki Matsubara; Hideo Numata, both of Tokyo, Japan

[73] Assignee: Oval Engineering Co., Ltd., Tokyo, Japan

[21] Appl. No.: 534,915

[22] Filed: Sep. 22, 1983

[30] Foreign Application Priority Data

Oct. 4, 1982 [JP] Japan ................. 57-173250

[51] Int. Cl.³ .................................... H01L 41/08
[52] U.S. Cl. .................................... 310/340; 310/344; 310/365; 310/334; 310/331
[58] Field of Search ............... 310/340, 344, 330–332, 310/365, 334

[56] References Cited

U.S. PATENT DOCUMENTS

| 2,289,954 | 7/1942 | Arndt, Jr. | 310/340 X |
| 2,483,677 | 10/1949 | Swinehart | 310/340 |
| 2,558,563 | 6/1951 | Janssen | 310/340 X |
| 3,031,591 | 4/1962 | Cary et al. | 310/340 X |
| 3,054,982 | 9/1962 | Keiser | 310/358 X |
| 3,509,389 | 4/1970 | Vrataric, Jr. | 310/340 X |
| 3,821,747 | 6/1974 | Mason | 310/332 X |

FOREIGN PATENT DOCUMENTS 739632 11/1955 United Kingdom ............. 310/340

Primary Examiner—Mark O. Budd
Attorney, Agent, or Firm—Jordan and Hamburg

[57] ABSTRACT

A piezoelectric sensor for measuring an external force is disclosed which is accommodated in a cassette through a sealing member and provided with a pair of electrodes which are respectively bonded to opposite sides of a piezoelectric element. A masking strip made of a highly insulative material covers the whole area of and end face of the piezoelectric element, which is exposed to the outside of the sensor, and a desired width of an end face of each of the electrodes adjacent to the end face of the piezoelectric element. This maintains a high resistance between the electrodes having the piezoelectric element therebetween and thereby promotes accurate measurement without being effected by changes in the resistance of the sealing member due to temperature variation. The sensor is effectively applicable to a vortex flow meter.

3 Claims, 9 Drawing Figures

ELECTRODE CONNECTIONS FOR A PIEZOELECTRIC SENSOR

BACKGROUND OF THE INVENTION

The present invention relates to a piezoelectric sensor and, more particularly, to an improvement in a piezoelectric sensor for use with a vortex flow meter.

There has been proposed and put to practical use a piezoelectric sensor of the type having a piezoelectric element sandwiched between conductive electrodes. When an external force is imparted to the sensor, the sensor senses a magnitude of the force by detecting a voltage which is generated by the deformation of the piezoelectric element originating from the external force.

A piezoelectric sensor of the type described is rarely used naked or exposed to the outside and usually is embedded in a detector member or cassette through a glass or like sealing member. When the cassette deforms in response to an external force, the sensor will be deformed integrally with the cassette. The prior art piezoelectric sensor, however, suffers from the drawback that the volume resistivity of the material constituting the sealing member tends to decrease in response to temperature elevation. This is reflected by a decrease in the resistance between the electrodes sandwiching the piezoelectric element therebetween and, thereby, a decrease in the output and, thereby, a decrease in the accuracy of measurement.

SUMMARY OF THE INVENTION

It is therefore an object of the present invention to provide a piezoelectric sensor which is capable of measuring an external force with high sensitivity and accuracy without being effected by a change in the resistance of a sealing member which is accommodated in a detector member or cassette integrally with a piezoelectric member and conductive electrodes.

It is another object of the present invention to provide a new piezoelectric sensor which is effectively applicable to a vortex flow meter.

It is another object of the present invention to provide a generally improved piezoelectric sensor.

In one aspect of the present invention, there is provided a piezoelectric sensor which comprises at least one piezoelectric element, a pair of electrodes respectively bonded to opposite side faces of the piezoelectric element, and a cover member for covering a whole end face of the piezoelectric element which is exposed to the outside of the sensor and a predetermined area of an end face of each of the electrodes which neighbors the end face of the piezoelectric element. The cover member is made of a highly insulating material.

In another aspect of the present invention, there is provided a piezoelectric sensor which comprises two piezoelectric elements, a first electrode bonded at one side face to one side face of one of the piezoelectric elements and at the other side face to one side face of the other piezoelectric element, a second electrode bonded to the other side face to one of the piezoelectric elements, a third electrode bonded to the other side face of the other piezoelectric element and two cover members for respectively covering whole end faces of the piezoelectric elements which are exposed to the outside of the sensor and predetermined areas of end faces of the piezoelectric elements. Each of the cover members is made of a highly insulative material.

In accordance with the present invention, a piezoelectric sensor for measuring an external force is disclosed which is accommodated in a cassette through a sealing member and provided with a pair of electrodes which are respectively bonded to opposite sides of a piezoelectric element. A masking strip made of a highly insulative material covers the whole area of an end face of the piezoelectric element, which is exposed to the outside of the sensor, and a desired width of an end face of each of the electrodes adjacent to the end face of the piezoelectric element. This maintains a high resistance between the electrodes having the piezoelectric element therebetween and thereby promotes accurate measurement without being effected by changes in the resistance of the sealing member due to temperature variation. The sensor is effectively applicable to a vortex flow meter.

The above and other objects, features and advantages of the present invention will become apparent from the following detailed description taken with the accompanying drawings.

DESCRIPTION OF THE PREFERRED EMBODIMENT

While the piezoelectric sensor of the present invention is susceptible of numerous physical embodiments, depending upon the environment and requirements of use, a substantial number of the herein shown and described embodiment have been made, tested and used, and all have performed in an eminently satisfactory manner.

Figure 1:
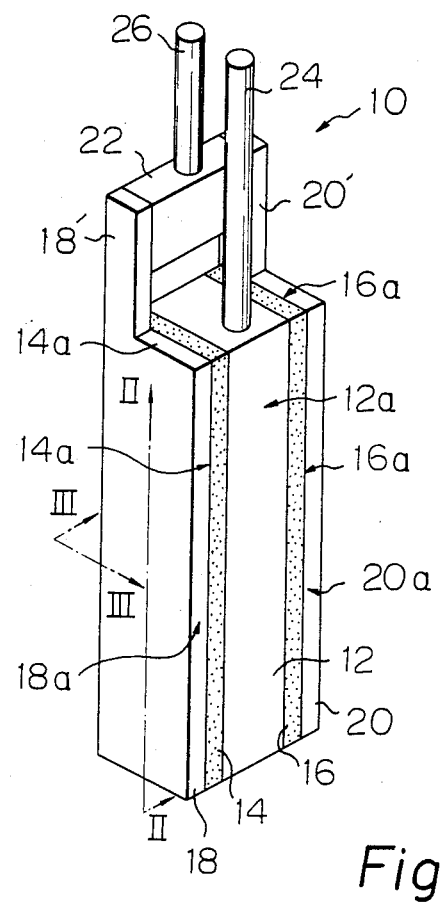
FIG. 1 is a perspective view of a piezoelectric sensor shown in a condition before the application of highly insulative masking strips in accordance with the present invention.
Figure 2:
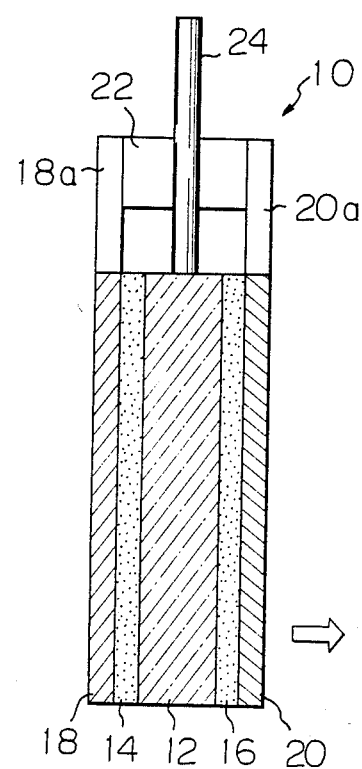
FIG. 2 is a section along line II—II of FIG. 1.
Figure 3:
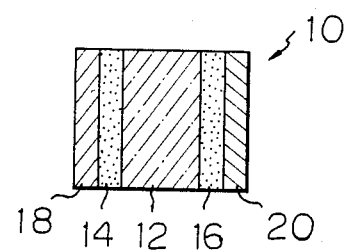
FIG. 3 is a section along line III—III of FIG. 1.

Referring to FIGS. 1-3, a piezoelectric sensor to which the present invention is applicable is shown and generally designated by the reference numeral 10. The piezoelectric sensor 10 includes a center electrode 12 made of metal such as stainless steel (JIS SUS316) or nickel. Piezoelectric elements 14 and 16 are bonded to opposite sides of the center electrode 12 and respectively carry therewith side electrodes 18 and 20 which are made of a material similar to the center electrode 12. The side electrode 18 has an upward extension 18' and the side electrode 20, an upward extension 20' which faces the extension 18'. A metal fixture 22 spans the opposite extensions 18' and 20' and are bonded thereto. Rod electrodes 24 and 26 made of stainless steel (JIS SUS316) or sealing alloy, for example, are studded on the center electrode 12 and metal fixture 22, respectively.

Suppose that an external force is imparted to the piezoelectric sensor 10 to deform it in a direction indicated by an arrow in FIG. 2. Then, the piezoelectric elements 14 and 16 are flexed in the same direction to develop a voltage proportional to the external force between the center electrode 12 and each of the opposite side electrodes 18 and 20. The electrodes 18 and 20 are electrically connected to each other by the metal fixture 22, while the center electrode 12 serves as an electrode for both the piezoelectric elements 14 and 16. Suitably selecting the polarities of the piezoelectric elements 14 and 16 will develop a two times higher voltage across the rod electrodes 24 and 26 than in the case with a single piezoelectric element.

As previously mentioned, the piezoelectric sensor 10 is installed in a desired detector member after having its all surfaces covered with a sealing member made of glass or the like. Therefore, should the resistance of the sealing member be insufficient, it would allow the current to leak through parts thereof which are interposed between the surfaces of the center electrode 12 and side electrode 18 and between those of the center electrode 12 and side electrode 20. Such current leakage would naturally result in a substantial drop in the output level across the rod electrodes 24 and 26.

Figure 4:
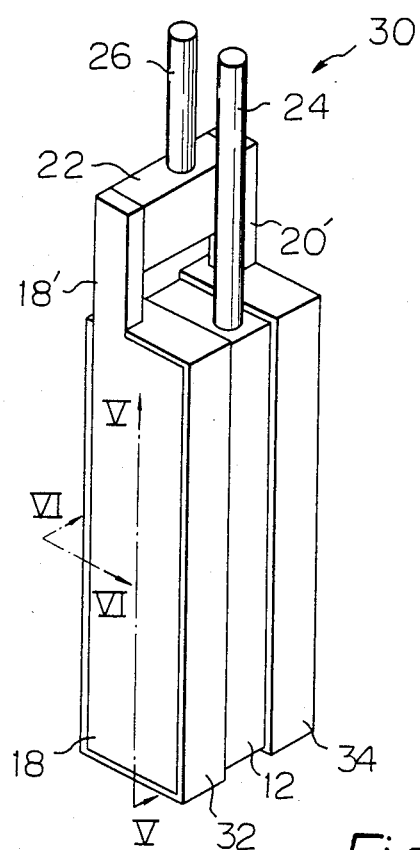
FIG. 4 is a perspective view of a piezoelectric sensor embodying the present invention.
Figure 5:
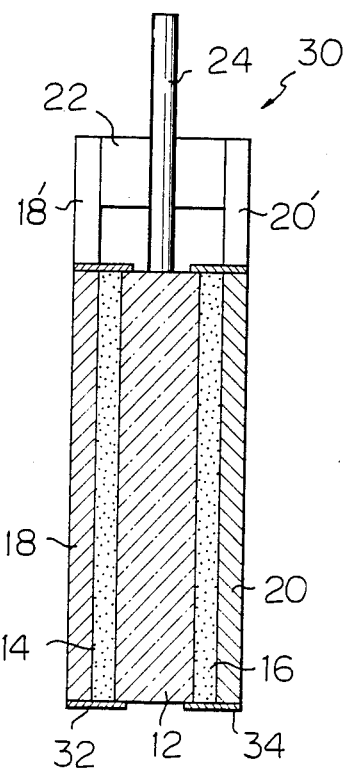
FIG. 5 is a section along line V—V of FIG. 4.
Figure 6:
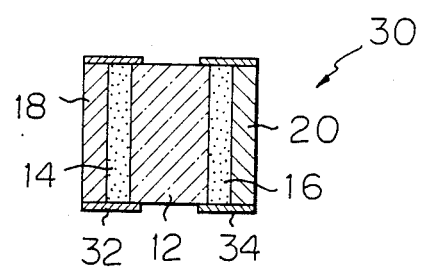
FIG. 6 is a section along line VI—VI of FIG. 4.

The present invention overcomes the drawback discussed above by providing a piezoelectric sensor 30 which employs, as shown in FIGS. 4–6, a pair of masking strips or covers 32 and 34 which respectively cover the exposed end faces 14a and 16a of the piezoelectric elements 14 and 16 and desired widths of end faces 12a, 18a and 20a of the adjacent electrodes 12, 18 and 20. The masking strips 32 and 34 are individually made of a highly insulative material. In detail, the masking strip 32 covers the end face 14a of the piezoelectric element 14 and those areas of the center electrode 12 and side electrode 18 which neighbor the end face 14a of the piezoelectric element 14. Likewise, the masking strip 34 covers the end face 16a of the piezoelectric element 16 and those areas of the center electrode 12 and side electrode 20 which neighbor the end face 16a of the piezoelectric element 16. Concerning the material of the masking strips 32 and 34, it is preferable to use a coating agent which is based on a ceramic composition. With this construction, the piezoelectric sensor 30 is capable of preserving high sensitivity and accuracy of measurement even if the sealing member, which covers the whole sensor structure, has its resistance lowered due to temperature elevation, because the masking strips 32 and 34 are effective to prevent a current from leaking across the electrode surfaces through the sealing member.

The construction shown in FIGS. 4–6 is intended to show a minimum necessary region to be covered for the purpose concerned and may be modified to mask a larger area. For example, all the surfaces of the piezoelectric sensor 30 may be concealed by either one of the covers 32 and 34 in order to further enhance the insulation between the piezoelectric sensor 30 and a detector member.

To pick up outputs from the side electrodes 18 and 20, it has been customary to weld leads to the side or end faces of the side electrodes 18 and 20 with the aid of gold paste, for example. A problem encountered with this system is that not only the leads are apt to be broken, but an extremely intricate jig construction is required for supporting the sensor and leads during the welding operation.

This problem is solved by the piezoelectric sensor 30 of the present invention in which the side electrodes 18 and 20 are partly projected upwardly to form the flat extensions 18' and 20' as previously described. The extensions 18' and 20' individually serve as output pickup sections. The metal fixture 22 is rigidly connected to the extension 18' at one end and to the extension 20' at the other end. The rod electrode 26 is studded on the metal fixture 22. This offers various advantages such as freeing the output pickup sections from breakage, facilitating bonding of the metal fixture 22 by welding, and simplifying a preformed glass structure which is adapted to seal the whole sensor 30.

Now, application of the piezoelectric sensor of the present invention to a vortex flow meter will be described.

In a known type of vortex flow meter, a bluff body or vortex shedder is disposed in a conduit through which intended fluid flows. The flow meter measures a flow rate of the fluid in terms of a frequency of oscillation of the bluff body which is caused by a vortex train being shed in the fluid downstream of the vortex shedder. The piezoelectric sensor 30 of the present invention finds application to such a flow meter for sensing the oscillation of the bluff body.

Figure 7:
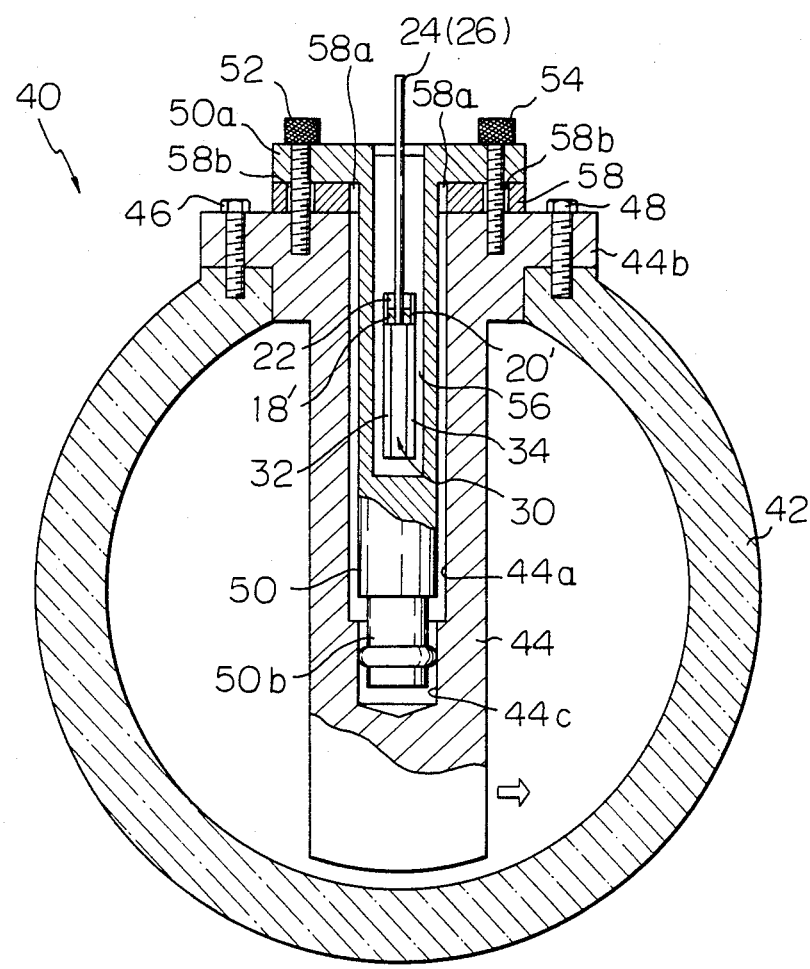
FIG. 7 is a section of a vortex flow meter to which a piezoelectric sensor of the present invention is applied.

Referring to FIG. 7, a vortex flow meter of the type described is shown which incorporates the piezoelectric sensor 30 therein. Fluid whose flow rate is to be measured flows through a conduit 42. The flow meter, generally 40, includes an elongate bluff body or vortex shedder 44 fastened to the wall of the conduit 42 by means of screws 46 and 48 in such manner that major part thereof extends across the interior of the conduit 42. The cross-sectional shape of the bluff body 44 may be, but not limited to, a triangle. The bluff body 44 is formed with a bore 44a, and a flange 44b at the outermost end thereof. A cassette 50, serving as a detector member, is inserted into the bore 44a of the bluff body 44 and has a flange 50a at its outermost end which is fastened to the flange 44b by means of screws 52 and 54. The other or innermost end portion 50b of the cassette 50 is press-fit in a bore 44c which is contiguous with the bottom of the bore 44a in the bluff body 44. The sensor 30, which may have the construction shown in FIG. 4, is rigidly held in place within the cassette 50 by a sealing member 56 made of glass or like sealing material. For the purpose which will be described, a seat member 58 is interposed between the flange 50a of the cassette 50 and the flange 44b of the bluff body 44.

In operation, as the fluid flows through the conduit 42, a vortex train is shed in the conduit downstream of the bluff body 44 in the manner well known in the art. The vortex train causes the bluff body 44 to oscillate perpendicularly to the direction of the fluid flow, that is, to the right and left as seen in FIG. 7. This is accompanied by the oscillation of the cassette 50 within the bore 44a of the bluff body 44, because the cassette innermost end is press-fit in the bore 44c. As a result, the sensor 30 integrally mounted in the cassette 50 is deformed and its oscillation frequency is sensed as a change in voltage.

Now, the seat member 58 between the flanges 44b and 50a effectively functions when the cassette 50 in the bluff body 44 is replaced with new one. If the innermost end portion 50b of the new cassette 50 is press-fit in the same position as that of the old cassette 50, intimate contact between the press-fit end portion 50b and the wall of the bore 44c of the bluff body 44 will fail to bring about a drop of output level and generate noise. The incomplete contact may be overcome by employing a new cassette 50 whose end portion 50b is larger in outside diameter than that of the old cassette 50. However, this cannot be practiced without troublesome work for parts management, keeping a record on the frequency of the replacement, etc.

Figure 8:
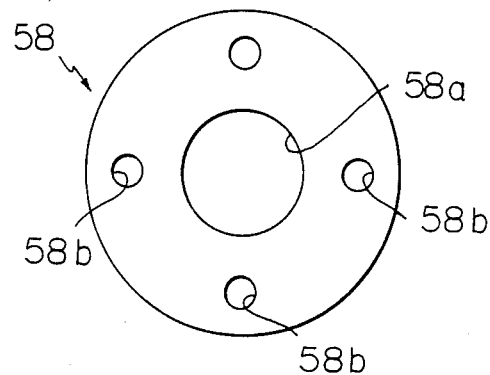
FIG. 8 is a plan view of a seat member incorporated in the vortex flow meter of FIG. 7.

In accordance with the present invention, the seat member 58 shown in FIG. 7 is replacable with another in the event of replacement of the cassette 50. Replacing the seat member 58 with thinner one allows the innermost end of a new cassette 50 to be press-fit deeper into the bluff body 44, thereby solving the problem of the incomplete contact. The seat member 58 is shown in a plan view in FIG. 8. As shown, the seat member 58 is formed with an opening 58a for receiving the cassette 50, and apertures 58b for receiving the screws 52 and 54.

Figure 9:
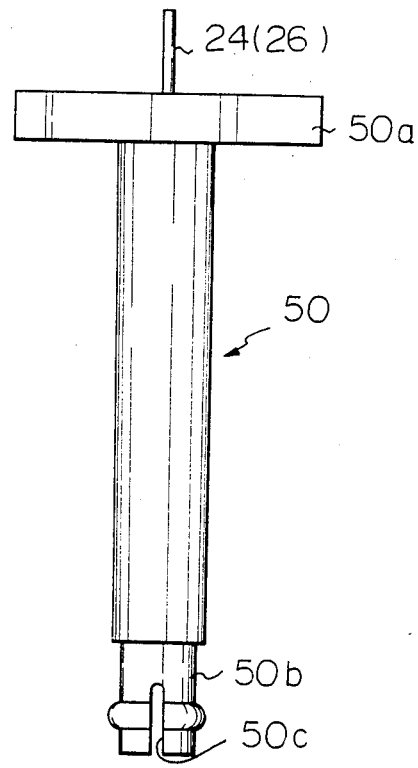
FIG. 9 is a section of another example of a sensor cassette for a vortex flow meter which employs a piezoelectric sensor in accordance with the present invention.

Referring to FIG. 9, another possible form of the cassette is shown which is distinguishable from the first form by the unique configuration of its innermost end portion. As shown, the innermost end portion 50b of the cassette 50 is formed with a slit 50c in order to facilitate press-fitting of the portion 50b into the bore 44c of the bluff body 44. Usually, the end portion 50b of the cassette 50 has to be engaged with the wall of the bore 44c in such a manner as to press it with a suitable magnitude of force. This requires the end portion 50b to have an accurately calibrated outside diameter and, therefore, be machined with extreme precision. The slit 50c formed in the end portion 50b in the manner shown in FIG. 9 alleviates the precision situation. Even if the outside diameter of the end portion 50b is designed somewhat larger than the inside diameter of the bore 44c, the end portion 50b will yield inwardly to be readily press-fit in the bore 44c. Therefore, it is needless to accurately machine the outside diameter of the end portion 50b.

The illustrated orientation of the slit 50c in the cassette 50 is not limitative and open to choice. It will be apparent that the slit 50c shown in FIG. 9 is applicable to the flow meter shown in FIG. 7 which includes the seat member 58.

Various modifications will become possible for those skilled in the art after receiving the teachings of the present disclosure without departing from the scope thereof. For example, the number of the piezoelectric elements is not limited to two as in the case of FIGS. 1-6 but may be three or more or even one. Output pickup sections may comprise the conventional leads which are simply welded to side walls of electrodes, instead of those shown and described. Furthermore, the whole piezoelectric sensor may be disc-shaped if desired.

What is claimed is:

1. A piezoelectric sensor comprising, in combination:

two piezoelectric elements each having end faces and two side faces;

a first plate electrode having end faces and two side faces, one of said side faces of said first plate electrode being bonded to one side face of one of the piezoelectric elements and the other side face of said first plate electrode being bonded to one side face of the other piezoelectric element;

a second plate electrode bonded to the other side face of said one of the piezoelectric elements;

a third plate electrode bonded to the other side face of said other piezoelectric element;

said second and third plate electrodes each having parts thereof formed as output pickup sections which are integral extensions of the respective second and third plate electrodes, said first plate electrode and said two piezoelectric elements having a first generally common planar end face, said integral extensions extending beyond said first planar end face;

a metal fixture connected to said output pickup sections of the second and third plate electrodes to commonly pick up outputs of the second and third plate electrodes, said metal fixture being spaced from said first planar end face, said metal fixture and said integral extensions having a second generally common planar end face;

a first rod electrode connected to the end face of said first plate electrode which forms part of said first common planar end face;

a second rod electrode connected to the end face of the metal fixture which forms part of said second common planar end face; and two cover members for respectively covering the end faces of the two piezoelectric elements which are exposed to the outside of the sensor and predetermined areas of the end faces of the first, second and third plate electrodes adjacent to said end faces of the piezoelectric elements, each of said cover members being made of a highly insulative ceramic material to prevent current leakage.

2. A piezoelectric sensor according to claim 1 further comprising bonding means bonding said metal fixture to said output pickup sections.

3. A piezoelectric sensor according to claim 1 further comprising welding means joining said metal fixture to said output pickup sections.

* * * * *